United States Patent [19]

Kobayashi et al.

[11] Patent Number: 5,368,783
[45] Date of Patent: Nov. 29, 1994

[54] NEGATIVE-WORKING RADIATION-SENSITIVE RESIST COMPOSITION

[75] Inventors: Masakazu Kobayashi; Hatsuyuki Tanaka, both of Chigasaki; Toshimasa Nakayama, Hiratsuka, all of Japan

[73] Assignee: Tokyo Ohka Kogyo Co., Ltd., Kanagawa, Japan

[21] Appl. No.: 52,484

[22] Filed: Apr. 23, 1993

[30] Foreign Application Priority Data

May 1, 1992 [JP] Japan ................... 4-137542

[51] Int. Cl.$^5$ .................... G03C 1/00; G03C 5/00
[52] U.S. Cl. ................... 252/600; 430/325; 430/270
[58] Field of Search ............ 430/325, 495, 270; 252/582, 600

[56] References Cited

U.S. PATENT DOCUMENTS

| | | | |
|---|---|---|---|
| 3,954,475 | 5/1976 | Bonham et al. | 430/325 |
| 3,987,037 | 10/1976 | Bonham et al. | 430/325 |
| 4,367,281 | 1/1983 | Shibayama et al. | 430/325 |
| 4,469,778 | 9/1984 | Iwayanagi et al. | 430/325 |
| 5,034,304 | 7/1991 | Feely | 430/325 |
| 5,204,225 | 4/1993 | Feely | 430/325 |
| 5,258,265 | 11/1993 | Slater et al. | 430/325 |
| 5,266,440 | 11/1993 | Zampini | 430/325 |

OTHER PUBLICATIONS

Journal of Electrochemical Society, 118, 669 (1971).

*Primary Examiner*—Philip Tucker
*Attorney, Agent, or Firm*—Henry T. Burke

[57] ABSTRACT

Disclosed is a novel negative-working radiation-sensitive resist composition useful in the photolithographic patterning works of resist layers on substrate surfaces in the manufacture of semiconductor devices and capable of giving a finely patterned resist layer with high resolution and having an excellently orthogonal cross sectional profile of the line-wise patterned resist layer with an outstandingly high sensitivity to various actinic rays. The composition comprises, as the essential ingredients, (a) an alkali-soluble resin such as a cresol novolac resin, (b) a specific alkoxymethylated amino resin, e.g., methoxymethylated melamine resin, and (c) a specific triazine compound in a limited weight proportion.

9 Claims, No Drawings

NEGATIVE-WORKING RADIATION-SENSITIVE RESIST COMPOSITION

BACKGROUND OF THE INVENTION

The present invention relates to a novel negative-working radiation-sensitive resist composition or, more particularly, to a negative-working radiation-sensitive resist composition capable of exhibiting high resolution of patterning and high sensitivity to actinic rays to be suitable as a resist material for very fine patterning works in the field of electronic industries such as manufacture of various kinds of semiconductor devices and still capable of giving a patterned resist layer having a quite satisfactory cross sectional profile with high orthogonality.

Along with the rapid progress in recent years in the technology of manufacture of semiconductor devices with a trend toward more and more increased density of integration, the fineness in the fine patterning works is required to have a resolution in the sub-micron order. In the so-called photolithographic process as a major current in the fine patterning works for the manufacture of semiconductor devices, the resolution required for the fine patterning work is as small as 0.5 μm or even smaller so that it is a trend that the pattern-wise exposure of the resist layer is conducted by using ultraviolet light of a shorter and shorter wavelength such as the so-called deep ultraviolet light, i-line and g-line emitted from various kinds of ultraviolet light sources in the wavelength range of 200 to 500 nm, eximer lasers and KrF lasers emitting at a wavelength of 248 nm. Further, development works are under way for the use of X-rays and electron beams as the actinic rays for fine patterning.

Radiation-sensitive resist compositions used in such a photolithographic patterning work naturally must comply with the decreasing trend in the wavelength of the actinic rays for the patterning exposure. Various proposals and attempts have been made in this regard also for negative-working radiation-sensitive resist compositions. For example, Japanese Patent Publication 62-8777 discloses a resist composition comprising a phenol novolac resin and a bisazide compound having sensitivity for deep ultraviolet light, i-line and g-line and a resist composition comprising a chloromethylated polystyrene or polyvinyl phenol and a bisazide compound having sensitivity to excimer laser beams, Japanese Patent Kokai 62-164045 discloses a resist composition comprising a thermosetting resin and a halogenated organic compound, which absorbs chemical lines in the wavelength region of 210 to 299 nm, as a photoacid-generator having sensitivity to excimer laser beams, deep ultraviolet light and X-rays and resist compositions having sensitivity to electron beams are disclosed in Japanese Patent Publication 45-30285, Journal of Electrochemical Society, volume 118, page 669 (1971) and Japanese Patent Kokai 57-176034, of which the film-forming resinous ingredient is a polymethyl methacrylate, polyglycidyl methacrylate or chloromethylated polystyrene, respectively.

These negative-working radiation-sensitive resist compositions in the prior art, however, have a problem that the patterned resist layer obtained by using such a composition does not have a desirable orthogonal cross sectional profile with trailing skirts resulting in poor resolution of the pattern if not to mention their relatively low sensitivity to deep ultraviolet light, i-lie, g-line, excimer laser beams, electron beams and X-rays not to meet the requirements in the modern patterning works. Thus, none of the negative-working radiation-sensitive resist compositions can be used in the photolithographic patterning works in which a resolution of 0.5 μm or even finer is required by using short wavelength actinic rays. Accordingly, it is eagerly desired in the technology of semiconductor devices to develop a negative-working radiation-sensitive resist composition capable of giving a patterned resist layer having high resolution and a desirable orthogonal cross sectional profile and still having high sensitivity to various kinds of actinic rays.

SUMMARY OF THE INVENTION

The present invention accordingly has an object to provide a novel and improved negative-working radiation-sensitive resist composition having high sensitivity to various kinds of actinic rays and capable of giving a patterned resist layer having high resolution and a desirable orthogonal cross sectional profile.

Thus, the negative-working radiation-sensitive resist composition of the present invention is a uniform blend which comprises:

(a) a novolac resin or a poly(hydroxystyrene) resin;
(b) an alkoxymethylated amino resin; and
(c) a triazine compound represented by the general formula

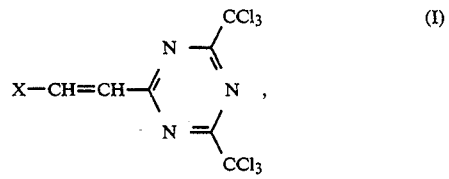

in which X is a 3,5-dialkoxyphenyl group, 2-furyl group or 5-alkoxy-2-furyl group.

DETAILED DESCRIPTION OF THE PREFERRED EMBODIMENTS

As is described above, the inventive resist composition comprises, as the essential ingredients, the components (a), (b) and (c), of which the components (a) and (b) serve as a film-forming constituent and it is essential in the inventive resist composition that these two types of resins are used in combination while the component (c) serves to impart the composition with sensitivity to actinic rays.

The component (a) in the inventive resist composition is an alkali-soluble resin selected from the group consisting of novolac resins, acrylic resins, copolymers of styrene and acrylic acid, polymers of hydroxystyrene, polyvinyl phenols, poly(α-methyl vinyl phenols) and the like of which polymers of hydroxystyrene and novolac resins are preferred. Alkali-soluble novolac resins are more preferable. The alkali-soluble novolac resins are not particularly limitative and any of conventional novolac resins used as a film-forming agent heretofore in positive-working photosensitive resin compositions can be used as the component (a) including those resins prepared by the condensation reaction of a phenolic compound such as phenol, cresol, xylenol and the like and an aldehyde such as formaldehyde in the presence of an acidic catalyst. Preferably, the alkali-soluble novolac resin has a weight-average molecular weight in the range from 2000 to 20,000 or, more preferably, from 3000 to 15,000 after removal of fractions of lower molecular weights by fractional precipitation.

In particular, the alkali-soluble novolac resin used as the component (a) in the inventive resist composition is prepared by the condensation reaction carried out in a mixture of a phenolic compound such as phenol, m- and p-cresols, 2,5- and 3,5-xylenols and the like or a combination of two kinds or more thereof and formalin in the presence of an acidic catalyst such as oxalic acid.

Although such an alkali-soluble novolac resin is conventional as a film-forming resinous ingredient of photosensitive resin compositions in the prior art, it is preferable to use, as the component (a) in the inventive resist composition, a novolac resin prepared from a mixture of phenolic compounds consisting of a first phenolic compound which is phenol or m-cresol and a second phenolic compound selected from the group consisting of p-cresol, 2,5-xylenol and 3,5-xylenol. More preferably, the mixture of phenolic compound contains at least 30% by weight of m-cresol and the balance of p-cresol, 2,5-xylenol and/or 3,5-xylenol when improvement is desired in the cross sectional profile of the patterned resist layer formed by using the inventive resist composition.

Polymers of hydroxystyrene as the other class of the preferable alkali-soluble resins as the component (a) in the inventive resist composition are also not particularly limitative but it is preferable to use a polymer having a weight-average molecular weight in the range from 3000 to 50,000 or, more preferably, from 5000 to 30,000.

The component (b), which is a part of the film-forming resinous ingredient in the inventive resist composition as combined with the component (a), is an alkoxymethylated amino resin exemplified by alkoxymethylated melamine resins and alkoxymethylated urea resins. These alkoxymethylated amino resins can be prepared, for example, by subjecting melamine or urea and formalin to a condensation reaction in a boiling aqueous solution to give a condensation product which is then subjected to an etherification reaction with a lower alcohol such as methyl, ethyl, propyl and butyl alcohols followed by cooling of the reaction mixture so as to precipitate the resinous product which is collected, washed and dried.

The alkoxymethylated melamine resins and urea resins as classes of the alkoxymethylated amino resins as the component (b) in the inventive resist composition include various types such as methoxymethylated, ethoxymethylated, propoxymethylated and butoxymethylated melamine resins and methoxymethylated, ethoxymethylated, propoxymethylated and butoxymethylated urea resins. These alkoxymethylated amino resins can be used without particular limitations either singly or as a combination of two kinds or more according to need.

Of the two classes of the alkoxymethylated amino resins mentioned above, alkoxymethylated melamine resins are preferred to the alkoxymethylated urea resins. An alkoxymethylated melamine resin can be prepared from a conventional methylol melamine by converting the methylol groups into desired alkoxymethyl groups. It is preferable to use an alkoxymethylated melamine resin of which the average number of the methylol groups converted into alkoxymethyl groups is at least 2.5 or, more preferably, at least 3.5 per single melamine ring. Several commercial products of such an alkoxymethylated melamine resins are available on the market and can be used as such as the component (b) in the inventive resist composition. Some of the commercial grades of such products include Nikalacs Mx-750, Mx-706, Mx-101, Mx-032, Mx-708, Mx-40, Mx-31, Ms-11, Mw-22 and Mw-30 manufactured and sold by Sanwa Chemical Co. They can be used either singly or as a combination of two kinds or more according to need.

The component (c) in the inventive resist composition is a triazine compound represented by the above given general formula (I), in which X is a 3,5-dialkoxyphenyl group, 2-furyl group or 5-alkyl-2-furyl group. When X is a 3,5-dialkoxyphenyl group, the triazine compound is a dialkoxyphenylethenyl-substituted triazine compound represented by the general formula

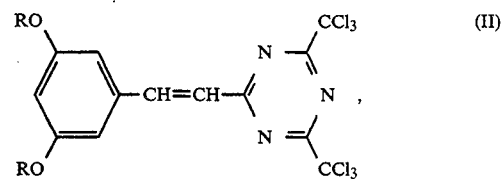

in which each R is, independently from the other, an alkyl group having 1 to 3 carbon atoms. When X in the general formula (I) is a 2-furyl or 5-alkyl-2-furyl group, the triazine compound is represented by the general formula

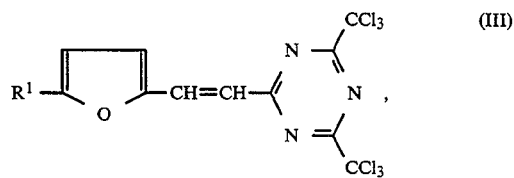

in which $R^1$ is a hydrogen atom or an alkyl group having 1 to 3 carbon atoms.

Particular examples of the triazine compound suitable as the component (c) in the inventive resist composition include:

2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine and the like.

These triazine compounds can be used either singly or as a combination of two kinds or more according to need as the component (c).

The alkali-soluble resin, e.g., a novolac resin, as the component (a) and the alkoxymethylated amino resin as the component (b) in the inventive resist composition are used in such a weight proportion that the ratio of the component (a) to the component (b) is in the range from 60:40 to 99:1 or, preferably, from 75:25 to 98:2, When the weight proportion of these resins is outside of the above mentioned range, no high-performance resist composition can be obtained even by using the component (c). The amount of the triazine compound as the component (c) in the inventive resist composition is in the range from 0.5 to 15 parts by weight or, preferably, from 1 to 10 parts by weight per 100 parts by weight of the total amount of the components (a) and (b). When the amount thereof is too small, the composition would not work as a negative-working radiation-sensitive resist composition while, when the amount thereof is too large, the developability of the resist composition would be decreased due to the decreased solubility thereof in an aqueous alkaline developer solution.

It is optional that the resist composition of the invention is further admixed according to need with various kinds of known additives having compatibility with the essential ingredients including, for example, auxiliary resins to improve the film properties of the resist layer, plasticizers, stabilizers, surface active agents, coloring agents to improve the visibility of the patterned resist layer formed by development, additional sensitizers to increase the sensitivity of the resist composition to actinic rays and dyes to prevent halation and so on each in a limited amount.

It is usual and convenient that the resist composition of the invention is used in the form of a solution prepared by dissolving the above described essential and optional ingredients uniformly in a suitable organic solvent. Examples of suitable organic solvents include ketones such as acetone, methyl ethyl ketone, cyclohexanone, methyl isobutyl ketone, methyl isoamyl ketone and methyl tert-butyl ketone, polyhydric alcohols and derivatives thereof such as ethyleneglycol, propyleneglycol and diethyleneglycol as well as monomethyl, monoethyl, monopropyl, monobutyl and monophenyl ethers of ethyleneglycol, propyleneglycol, diethyleneglycol, ethyleneglycol monoacetate or diethyleneglycol monoacetate, cyclic ethers such as dioxane and esters such as methyl acetate, ethyl acetate, butyl acetate, methyl lactate, ethyl lactate, methyl pyruvate, ethyl pyruvate and ethyl 3-ethoxypropionate. These organic solvents can be used either singly or as a mixture of two kinds or more according to need.

Following is a description of the procedure for forming a finely patterned resist layer on the surface of a substrate such as a semiconductor silicon wafer by using the negative-working radiation-sensitive resist composition of the invention in the form of a solution. Thus, the surface of a substrate is uniformly coated with the solution of the resist composition by using a spinner or other suitable coating machine followed by drying to form a uniform layer of the composition which is then exposed pattern-wise to actinic rays such as g-line, i-line, deep ultraviolet light, excimer laser beams and X-rays through a photomask bearing a desired pattern or irradiated pattern-wise with electron beams scanned along the programmed pattern to form a latent image followed by a heat treatment. Thereafter, the latent image is developed with an aqueous solution of an organic alkaline compound such as tetramethyl ammonium hydroxide and choline in a concentration of 2 to 10% by weight as a developer solution so that the resist layer in the unexposed areas is selectively dissolved away by the developer solution while the resist layer on the exposed areas imparted with decreased solubility is left undissolved forming a patterned resist layer having an excellently orthogonal cross sectional profile.

In the following, the negative-working radiation-sensitive resist composition of the present invention is described in more detail by way of examples, which, however, never limit the scope of the invention in any way.

In the following examples, the performance of each of the resist compositions prepared there was evaluated for the items including sensitivity, resolution and cross sectional profile of the patterned resist layer according to the procedures described below.

Sensitivity

A 5-inch silicon wafer after a surface treatment by keeping for 7 minutes in the vapor of hexamethyl disilazane was coated with the resist solution on a spinner rotating at 4000 rpm for 20 seconds to form a resist layer which was dried by heating on a hot plate at 90° C. for 90 seconds to form a dried uniform resist layer having a thickness of 1.0 $\mu$m. The resist layer was exposed pattern-wise to the i-line or g-line on a minifying projection exposure machine for i-line exposure (Model NSR-1755i7A, manufactured by Nikon Co.) or a machine for g-line exposure (Model 1505G7E, manufactured by Nikon Co.), respectively, for a length of time increased from 100 ms (milliseconds) with stepwise increments of each 10 ms followed by a heat treatment at 110° C. for 90 seconds and a development treatment at 23° C. for 65 seconds in a 2.38% by weight aqueous solution of tetramethyl ammonium hydroxide using a paddle-type developer machine to remove the resist layer on the unexposed areas so that a patterned resist layer was obtained after rinse with water for 30 seconds and drying. The minimum exposure time by which a patterned resist layer of good resolution could be obtained by the above described procedure was recorded as the sensitivity of the resist composition.

Resolution

The same procedure as the above described procedure for the determination of the sensitivity was undertaken for line-and-space patterns of different widths and the minimum width of the patterned resist layer which could be obtained with good resolution when the exposure time was minimum corresponding to the sensitivity was recorded as the resolution of the resist composition.

Cross sectional profile of the patterned resist layer

A patterned resist layer on a substrate was formed in the same manner as in the determination of the sensitivity described above and the line-wise patterned resist layer was examined with a scanning electron microscope to find the cross sectional profile of the line which was recorded and rated as A, B and C when the cross sectional profile had good orthogonality, fair orthogonality with slightly rounded shoulders or with small trailing skirts and a trapezoidal form, respectively.

EXAMPLE 1

A resist composition in the form of a solution was prepared by dissolving, in 100 g of ethyl lactate, 30 g of a cresol novolac resin having a weight-average molecular weight of 6000 obtained by the condensation reaction of a 70:30 weight mixture of m-cresol and p-cresol with admixture of formalin in the presence of oxalic acid as an acidic catalyst and 8 g of an alkoxymethylated melamine resin, of which the average number of the methoxymethyl groups was 3.5 per melamine ring (Nikalac Mx-750, a product by Sanwa Chemical Co.) to give a solution which was further admixed with 2,4-bis(trichloromethyl)-6-[2-(5-methyl-2-furyl)ethenyl]-s-triazine in an amount of 5% by weight based on the total amount of the cresol novolac resin and the alkoxymethylated melamine resin followed by filtration of the solution under pressurization through a membrane filter of 0.2 $\mu$m pore diameter.

The above prepared resist composition was evaluated the above described procedures by exposure to the i-line. The resist layer in a line-and-space pattern of 0.50 μm width obtained in this manner had a cross sectional profile of quite good orthogonality rated as A standing upright on the substrate surface. The sensitivity of the resist layer to the i-line was 220 ms.

EXAMPLES 2 TO 11

The experimental procedure in each of these Examples was substantially the same as in Example 1 described above except that the cresol novolac resin used in Example 1 was replaced in Examples 9 to 11 with the same amount of a polyhydroxystyrene and the amount of the alkoxymethylated melamine resin Nikalac Mx-750 was varied in each of the Examples as indicated in Table 1 below. Further, the triazine compound was one of the three compounds I, II and III shown below in an amount as indicated in the table in % by weight based on the total amount of the cresol resin or polyhydroxystyrene and the alkoxymethylated melamine resin.

Triazine compound I: 2,4-bis(trichloromethyl)-6-[2-(3,5-dimethoxyphenyl)ethenyl]-s-triazine Triazine compound II : 2,4-bis(trichloromethyl)-6-[2-(2-furyl)ethenyl]-s-triazine Triazine compound III: 2,4-bis(trichloromethyl)-6-[2-(5-methyl-2-furyl)ethenyl]-s-triazine The results of the experiments were that the resolution of the patterned resist layer was 0.4 μm and the cross sectional profile of the line-patterned resist layer rated as A was as satisfactory in all of the Examples 2 to 11 as in Example 1 while the sensitivity of the resist compositions to the i-line light was as shown in Table 1.

TABLE 1

| Example | Alkoxy-methylated melamine, g | Triazine compound Kind | Amount, % by weight | Sensitivity, ms |
|---|---|---|---|---|
| 2 | 5 | I | 3 | 300 |
| 3 | 8 | I | 5 | 240 |
| 4 | 10 | I | 7 | 220 |
| 5 | 15 | I | 9 | 260 |
| 6 | 1.5 | II | 5 | 140 |
| 7 | 3 | II | 7 | 150 |
| 8 | 5 | II | 10 | 180 |
| 9 | 8 | III | 5 | 220 |
| 10 | 10 | III | 7 | 200 |
| 11 | 20 | III | 10 | 260 |

EXAMPLE 12

The experimental procedure was substantially the same as in Example 1 except that 8 g of the alkoxymethylated melamine resin Nikalac Mx-750 were replaced with 1.5 g of an alkoxymethylated melamine resin of another grade, of which the average number of the methoxymethyl groups was 6 per melamine ring (Nikalac Mw-30, a product by Sanwa Chemical Co.) and ethyl lactate as the solvent was replaced with the same amount of ethyleneglycol monoethyl ether acetate. Further, the resist layer was exposed pattern-wise, instead of the i-line in Example 1, to the g-line light followed by a heat treatment at 110° C. for 90 seconds on a hot plate. The procedure of the development treatment was just the same as in Example 1.

The results of the experiment were that the resolution and the cross sectional profile of the line-and-space patterned resist layer having a width of 0.5 μm were as good as in Example 1 and the sensitivity of the resist composition to the g-line was 300 ms.

EXAMPLES 13 TO 19

The experimental procedure was substantially the same as in Example 12 except that the amount of the alkoxymethylated melamine resin Nikalac Mw-30 was varied as indicated in Table 2 and the triazine compound was one of the triazine compounds I, II and III specified above and added in an amount shown in Table 2 in % by weight based on the total amount of the cresol novolac resin and the alkoxymethylated melamine resin. The results obtained in each of these Examples were as satisfactory as in Example 12 in respects of the resolution and the cross sectional profile of the line-wise patterned resist layer. The sensitivity of the respective resist compositions to the g-line is shown in Table 2.

TABLE 2

| Example | Alkoxy-methylated melamine, g | Triazine compound Kind | Amount, % by weight | Sensitivity, ms |
|---|---|---|---|---|
| 13 | 1.5 | I | 5 | 320 |
| 14 | 3 | I | 8 | 340 |
| 15 | 5 | I | 10 | 360 |
| 16 | 1.5 | II | 8 | 400 |
| 17 | 3 | II | 10 | 420 |
| 18 | 3 | III | 8 | 330 |
| 19 | 5 | III | 10 | 360 |

EXAMPLES 20 AND 21

The experimental procedure in each of these examples was just the same as in Example 1 except that the amounts of the alkoxymethylated melamine resin Nikalac Mx-750 were 25 g and 3 g, respectively, and the amounts of the triazine compound were 3% and 0.3%, respectively, based on the total amount of the cresol novolac resin and the alkoxymethylated melamine resin. The results of the experiments were that the resolution of the line-wise patterned resist layer was 1.0 μm and 1.2 μm, respectively. The cross sectional profile of the line-wise patterned resist layer was rated as B and the sensitivity of the resist composition was 1000 ms in each these resist compositions.

EXAMPLES 22 AND 23

The experimental procedure was just the same as in Example 12 except that the amounts of the alkoxymethylated melamine resin Nikalac Mw-30 were 25 g and 3 g, respectively, and the amounts of the triazine compound were 3% and 0.3%, respectively, by weight based on the total amount of the cresol novolac resin and the alkoxymethylated melamine resin. The results of the experiments were that the resolution of the line-wise patterned resist layer was 1.2 μm and 1.5 μm, respectively and the cross sectional profile of the line-wise patterned resist layer was rated as B and the sensitivity of the resist layers to the g-line light was 1000 ms in each of these experiments.

Comparative Example 1

The experimental procedure was substantially the same as in Example 12 described above excepting replacement, of the triazine compound with the same amount of 2,4-bis(trichloromethyl)-6-(4-methoxyphenyl)-s-triazine. The results of the experiment were that the sensitivity was 2000 ms, resolution was 0.60 μm and cross sectional profile of the line-wise resist layer was rated as B to have no practicability in respect of the unduly low sensitivity.

Comparative Example 2

The experimental procedure was substantially the same as in Comparative Example 1 described above excepting an increase of the amount of the 2,4-bis(trichloromethyl)-6-(4-methoxyphenyl)-s-triazine to 8% by weight based on the total amount of the resinous ingredients and an increase of the amount of the alkoxymethylated melamine resin (Nikalac Mw-30) to 3 g. The results of the experiment were that the sensitivity was 2000 ms, resolution was 0.60 μm and cross sectional profile of the line-wise resist layer was rated as B to have no practicability in respect of the unduly low sensitivity.

Comparative Example 3

The experimental procedure was substantially the same as in Comparative Example 1 described above excepting an increase of the amount of the 2,4-bis(trichloromethyl)-6-(4-methoxyphenyl)-s-triazine to 10% by weight based on the total amount of the resinous ingredients and an increase of the amount of the alkoxymethylated melamine resin (Nikalac Mw-30) to 5 g. The results of the experiment were that the sensitivity was 2000 ms, resolution was 0.60 μm and cross sectional profile of the line-wise resist layer was rated as B to have no practicability in respect of the unduly low sensitivity.

Comparative Example 4

The experimental procedure was substantially the same as in Example 12 described above excepting replacement of the triazine compound with 2,4-bis(trichloromethyl)-6-[2-(2-benzofuryl)ethenyl]-s-triazine in an amount of 1.0% by weight based on the total amount of the resinous ingredients. The results of the experiment were that the sensitivity was 2000 ms, resolution was 0.60 μm and cross sectional profile of the line-wise resist layer was rated as B to have no practicability in respect of the unduly low sensitivity.

Comparative Example 5

The experimental procedure was substantially the same as in Comparative Example 4 described above excepting an increase of the alkoxymethylated melamine resin to 3 g. The results of the experiment were that the sensitivity was 2000 ms, resolution was 0.60 μm and cross sectional profile of the line-wise resist layer was rated as B to have no practicability in respect of the unduly low sensitivity.

Comparative Example 6

The experimental procedure was substantially the same as in Comparative Example 4 described above excepting an increase of the alkoxymethylated melamine resin to 5 g. The results of the experiment were that the sensitivity was 2000 ms, resolution was 0.60 μm and cross sectional profile of the line-wise resist layer was rated as B to have no practicability in respect of the unduly low sensitivity.

What is claimed is:

1. A negative-working radiation-sensitive resist composition as a uniform blend which comprises:
   (a) a novolac resin or a polyhydroxystyrene resin;
   (b) an alkoxymethylated amino resin; and
   (c) a triazine compound represented by the general formula

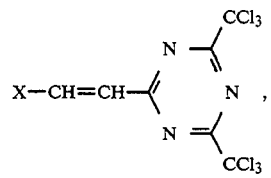

in which X is a 3,5-dialkoxyphenyl group, a 2-furyl group or a 5-alkyl-2-furyl group.

2. The negative-working radiation-sensitive resist composition as claimed in claim 1 in which the component (a) is a novolac resin.

3. The negative-working radiation-sensitive resist composition as claimed in claim 1 in which the component (b) is an alkoxymethylated melamine resin.

4. The negative-working radiation-sensitive resist composition as claimed in claim 3 in which the average number of the alkoxymethyl groups in the alkoxymethylated melamine resin is at least 2.5 per melamine ring.

5. The negative-working radiation-sensitive resist composition as claimed in claim 1 in which the weight proportion of the component (a) to the component (b) is in the range from 60:40 to 99:1.

6. The negative-working radiation-sensitive resist composition as claimed in claim 1 in which the amount of the component (c) is in the range from 0.5 to 15 parts by weight per 100 parts by weight of the total amount of the components (a) and (b).

7. The negative-working radiation-sensitive resist composition as claimed in claim 1 in which each of the alkoxy groups in the group denoted by X as a 3,5-dialkoxyphenyl group in the component (c) has 1 to 3 carbon atoms.

8. The negative-working radiation-sensitive resist composition as claimed in claim 1 in which the alkyl group in the group denoted by X as a 5-alkyl-2-furyl group in the component (c) has 1 to 3 carbon atoms.

9. The negative-working radiation-sensitive resist composition as claimed in claim 2 in which the novolac resin is a condensation product of a mixture of phenolic compounds consisting of a first phenolic compound selected from phenol and m-cresol and a second phenolic compound selected from the group consisting of p-cresol, 2,5-xylenol and 3,5-xylenol with formaldehyde.

* * * * *